United States Patent [19]
Yang

[11] Patent Number: 6,091,026
[45] Date of Patent: Jul. 18, 2000

[54] MULTI-LAYER PRINTED CIRCUIT BOARD WITH HUMAN DETECTABLE LAYER MISREGISTRATION, AND MANUFACTURING METHOD THEREFOR

[75] Inventor: Deok Gin Yang, Chungcheongbuk-do, Rep. of Korea

[73] Assignee: Samsung Electro-Mechanics Co. Ltd., Suwon, Rep. of Korea

[21] Appl. No.: 08/921,456

[22] Filed: Aug. 25, 1997

[30] Foreign Application Priority Data

Nov. 30, 1996 [KR] Rep. of Korea .................. 96-60277
May 22, 1997 [KR] Rep. of Korea .................. 97-20009

[51] Int. Cl.$^7$ .................................................. H05K 1/03
[52] U.S. Cl. ........................... 174/255; 174/250; 174/256
[58] Field of Search ..................... 174/250, 256, 174/255; 428/192, 209

[56] References Cited

U.S. PATENT DOCUMENTS

| | | | |
|---|---|---|---|
| 3,272,909 | 9/1966 | Bruck et al. | 174/262 |
| 5,093,183 | 3/1992 | Strunka | 428/195 |
| 5,266,380 | 11/1993 | Renguso et al. | 428/192 |
| 5,429,859 | 7/1995 | Young | 428/192 |

FOREIGN PATENT DOCUMENTS

| | | |
|---|---|---|
| 621616 | 1/1994 | Japan . |
| 653629 | 2/1994 | Japan . |
| 6179257 | 6/1994 | Japan . |

OTHER PUBLICATIONS

English Abstract of JP 621616 of Jan. 1994.
English Abstract of JP 6179257 of Jun. 1994.
English Abstract of JP 653629 of Feb. 1994.

*Primary Examiner*—Kristine Kincaid
*Assistant Examiner*—Jeremy Norris
*Attorney, Agent, or Firm*—Ladas & Parry

[57] ABSTRACT

A multi-layer printed circuit board for use in a computer mother board, a camera-incorporated multi-chip module (VTR MCM), a chip size package (CSP), a portable phone and the like, and a manufacturing method therefor, having a misregistration of layers that can be directly detected by human eyes. Also a wrong disposing of layers can be detected by human eyes accurately. A visually recognizable misregistration recognition strip and a visually recognizable wrongly disposed layer recognizing strip are provided on a router path of each of the circuited layers, for making it possible to detect the wrong disposition and the misregistration by human eyes.

6 Claims, 15 Drawing Sheets

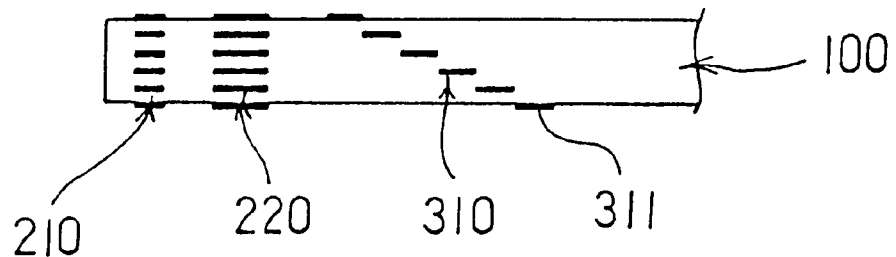
F I G. 8F
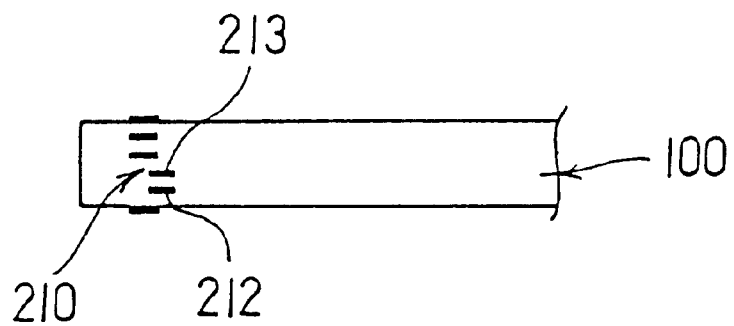
F I G. 9A
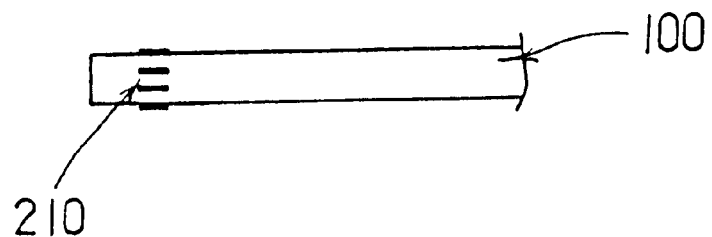
F I G. 9B

MULTI-LAYER PRINTED CIRCUIT BOARD WITH HUMAN DETECTABLE LAYER MISREGISTRATION, AND MANUFACTURING METHOD THEREFOR

BACKGROUND OF THE INVENTION

1. Field of the Invention

The present invention relates to a multi-layer printed circuit board for use in a computer mother board with human detectable layer misregistration, a camera-incorporated multi-chip module (VTR MCM), a chip size package (CSP), a portable phone and the like, and a manufacturing method therefor. Particularly, the present invention relates to a multi-layer printed circuit board and a manufacturing method therefor, in which a wrong disposing of layers and/or eccentricity can be easily detected.

2. Description of the Prior Art

In the midst of progress of the internal installation of electronic components, the multi-layer printed circuit board was invented. Since that time, studies have been briskly carried out to make the printed circuit board highly dense.

Recently, in accordance with the trend of high speed and high density of the electronic apparatuses, the printed circuit board in a numerously stacked form has been demanded, and therefore, the printed circuit board has become more complicated.

Generally, a multi-layer printed circuit board includes a copper clad laminate (to be called "CCL" below) which is formed by cladding copper foils on the both faces of an insulating layer. The multi-layer printed circuit board further includes inner circuited layers and outer circuited layers, which are stacked on the CCL, and on which circuit patterns are printed.

FIG. 1 illustrates the manufacturing process for the usual multi-layer printed circuit board in which six layers are stacked.

As shown in FIGS. 1A and 1B, in the case of a 6-layer circuit board, in order to form inner circuited layers 10, circuit patterns 14 are formed on the both faces of a CCL 11 by applying a photo-etching method as designed in advance. Then another CCL 13 is formed on which patterns are formed in the same way.

As shown in FIG. 1C, the inner circuited layers 10 can be obtained by disposing a plurality of the inner circuited layers on a CCL art work film 1. The CCL 11 and 13 form the inner circuited layers 10 after going through a stacking process as shown in FIG. 1B.

Specifically, in forming the inner circuited layers 10, an adhesive insulating sheet such as a prepreg 12 is stacked between the CCLs 11 and 13, and then, heat and pressure are applied. Under this condition, if two or more CCLs are used to form 4 or more inner circuited layers, then 6 or more circuited layers can be obtained unlike that illustrated in the drawings.

Then the inner circuited layers 10 are subjected to drillings, and then are electroplated. Then a via hole 15 is formed for electric conductions between the inner circuited layers. Thus, the inner circuited layers are formed.

Then as shown in FIG. 1D, prepregs 22 and 24 are stacked on the uppermost and lowermost faces of the inner circuited layers 10. Then in order to form outer circuited layers, CCLs or thin copper films 21 and 23 are stacked, and then the whole circuit board layers are subjected to heating and pressing.

Then as shown in FIG. 1E, a drilling and an electroplating are carried out on the circuit board as when forming the inner circuited layers, so as to form a through hole 25. The multi-layer printed circuit board thus formed is spread with a resist paste, and finally a routing is carried out by cutting with a router.

However, when manufacturing the above described multi-layer printed circuit board, during the stacking of the inner circuited layers and during the stacking of the inner and outer circuited layers, a circuit incoherence (circuit mismatching) (also to be called "misregistration") may occur depending on the skill of the worker and on a tolerance departure of a stacking pin (not shown in the drawings).

FIG. 2 illustrates an example of the circuit misregistration which has occurred during the stacking process. That is, FIG. 2A illustrates that a via hole 15a for making a second layer and a fifth layer electrically conducted is severely mismatched due to the misregistration during the stacking of the inner circuited layers 10.

FIG. 2B illustrates that the stacking of the inner and outer circuited layers is mismatched, and that a pattern 26a is severely mismatched at the through hole 25 (which is for making the outer circuited layers electrically conducted).

If such a misregistration occurs, the finished products are likely to show a lowered performance. If a less severe misregistration has occurred, electrical signals are emitted even during the final inspection, and therefore, the finished product makes it difficult to discriminate the defect, if a precise inspection is not carried out.

Meanwhile, during the manufacture of the usual multi-layer printed circuit board, a wrong disposing of the layers may occur either due to the short skill of the workers or by a process error. In this case, the problem is more serious than the misregistration. That is, in this case, the electrical characteristic values are considerably lowered. Accordingly, the finished products may show a severely lowered performance or have to be discarded, such cases being quite frequent.

Conventionally, in order to prevent the wrong disposing of layers, a number mark 40 is provided at a part of each layer 30 as shown in FIG. 3A. This number mark 40 shows the sequence of the stacking of the layers. FIG. 3B is a detailed illustration of FIG. 3A, and it shows a second layer.

To describe it based on a specific example, the following arrangements are provided in advance before stacking as shown in FIG. 3C. That is, arabic numerals 41–46 are marked on the both faces of the layers starting from the lowermost layer 37 (the first layer), through the second and third layers of the CCL 33, through the fourth and fifth layers of the CCL 31 and to the uppermost circuited layer 35. Thus the number mark 40 is provided.

The number mark 40 can be formed by photo-etching a copper foil or by attaching arabic numerals. Since prepregs 32, 36 and 38 are disposed between the circuited layers, and since the insulating layers between the CCLs are transparent, recognitions are possible to a certain degree if the number of the stacked layers is not large.

However, in the conventional technique in which the sequence of the layers is indicated by the arabic numerals, as the number of the stacked layers is increased, the arabic numerals indicating the sequence became non-recognizable. Therefore, not only the detection of the wrong disposing has become difficult, but particularly the misregistration cannot be checked. Furthermore, even if a wrong disposing of layers occurs, an electric checker cannot detect the abnormality. In addition, if a misregistration is passed as non-abnormal, then the electrical characteristic values are lowered, with the result that the product quality is greatly aggravated. Particularly in the case of the wrong disposing of layers, if the characteristic values are different after the installation of the component, a disorder may occur.

Therefore, a means for recognizing the misregistration and the wrong disposing of layers is in demand.

SUMMARY OF THE INVENTION

The present invention is intended to overcome the above described disadvantages of the conventional techniques.

Therefore it is an object of the present invention to provide a multi-layer printed circuit board in which a misregistration of layers can be directly detected by human eyes.

It is another object of the present invention to provide a multi-layer printed circuit board in which a misregistration of layers can be detected quickly and accurately.

It is still another object of the present invention to provide a multi-layer printed circuit board in which a wrong disposing of layers can be detected by human eyes accurately.

It is still another object of the present invention to provide a method for manufacturing a multi-layer printed circuit board in which a misregistration of layers can be prevented.

It is still another object of the present invention to provide a multi-layer printed circuit board in which a simultaneously detected by human eyes accurately.

It is still another object of the present invention to provide a method for manufacturing a multi-layer printed circuit board in which a misregistration of layers and a wrong disposing of layers can be prevented.

In achieving the above objects, the multi-layer printed circuit board according to the present invention includes: outer circuited layers disposed at uppermost and lowermost levels; inner circuited layers disposed between the outer circuited layers; and insulating layers formed between the respective outer and inner circuited layers, the multi-layer printed circuit further including: a misregistration recognition strip provided on a router path of each of the circuited layers and having a same length each, for making it possible to detect the misregistration by human eyes, centers of the misregistration recognition strips being aligned in a thickness direction.

In another aspect of the present invention, the multi-layer printed circuit board according to the present invention includes: outer circuited layers disposed at uppermost and lowermost levels; inner circuited layers disposed between the outer circuited layers; and insulating layers formed between the respective outer and inner circuited layers, the multi-layer printed circuit further including: a wrongly disposed layer recognizing strip provided on a router path of each of the circuited layers, for making it possible to detect the wrong disposition by human eyes, the wrongly disposed layer recognizing strips being shifted in one direction by a certain horizontal distance as coming up from a lowermost recognizing strip.

In still another aspect of the present invention, the multi-layer printed circuit board according to the present invention includes: outer circuited layers disposed at uppermost and lowermost levels; inner circuited layers disposed between the outer circuited layers; and insulating layers formed between the respective outer and inner circuited layers, the multi-layer printed circuit further including: a misregistration recognition strip and a wrongly disposed layer recognizing strip provided on a router path of each of the circuited layers, for making it possible to detect the wrong disposition and the misregistration by human eyes.

In still another aspect of the present invention, the method for manufacturing the multi-layer printed circuit board according to the present invention includes the steps of: forming a plurality of inner circuited layers, with circuit patterns being printed on CCLs; stacking insulating layers between the inner circuited layers; electroplating the stacked inner circuited layers; forming insulating layers on the electroplated inner circuited layers, stacking outer layers thereon, and forming printed circuit patterns on the stacked out layers; and routing the stacked inner and outer circuited layers, characterized in that, at the step of forming the printed circuit patterns on the inner and outer layers, a visually recognizable misregistration recognition strip having a same length is formed on a router path of each of the layers, centers of the misregistration recognition strips being aligned in a thickness direction.

In still another aspect of the present invention, the method for manufacturing the multi-layer printed circuit board according to the present invention includes the steps of: forming a plurality of inner circuited layers, with circuit patterns being printed on CCLs; stacking insulating layers between the inner circuited layers; electroplating the stacked inner circuited layers; forming insulating layers on the electroplated inner circuited layers, stacking outer layers thereon, and forming printed circuit patterns on the outer layers; and routing the stacked inner and outer circuited layers, characterized in that, at the step of forming the printed circuit patterns on the inner and outer layers, a visually recognizable wrongly disposed layer recognizing strip having a same length is formed on a router path of each of the layers, the wrongly disposed layer recognizing strips being shifted in one direction by a certain horizontal distance as coming up from a lowermost recognizing strip.

In still another aspect of the present invention, the method for manufacturing the multi-layer printed circuit board according to the present invention includes the steps of: forming a plurality of inner circuited layers, with circuit patterns being printed on CCLs; stacking insulating layers between the inner circuited layers; electroplating the stacked inner circuited layers; forming insulating layers on the electroplated inner circuited layers, stacking outer layers thereon, and forming printed circuit patterns on the outer layers; and routing the stacked inner and outer circuited layers, characterized in that, at the step of forming the printed circuit pattern on the inner and outer layers, a visually recognizable misregistration recognition strip and a visually recognizable wrongly disposed layer recognizing strip having a same length each are formed on a router path of each of the layers simultaneously.

BRIEF DESCRIPTION OF THE DRAWINGS

The above objects and other advantages of the present invention will become more apparent by describing in detail the preferred embodiment of the present invention with reference to the attached drawings in which:

FIGS. 2A–2D is a perspective view showing an example of the multi-layer printed circuit board of FIG. 1;

FIGS. 8A–8F is a schematic view showing the formation process for the misregistration recognizing strips and the wrongly disposed layer recognizing strips which are formed on a board together according to the present invention;

FIGS. 9A–9B is a schematic view showing the process of confirming a misregistration by utilizing the misregistration recognizing strips according to the present invention;

DETAILED DESCRIPTION OF THE PREFERRED EMBODIMENT

In the method of a multi-layer printed circuit board, a plurality of circuited layers are stacked, and then, a routing treatment is carried out by cutting the stacked board along a router path.

Figure 1A:
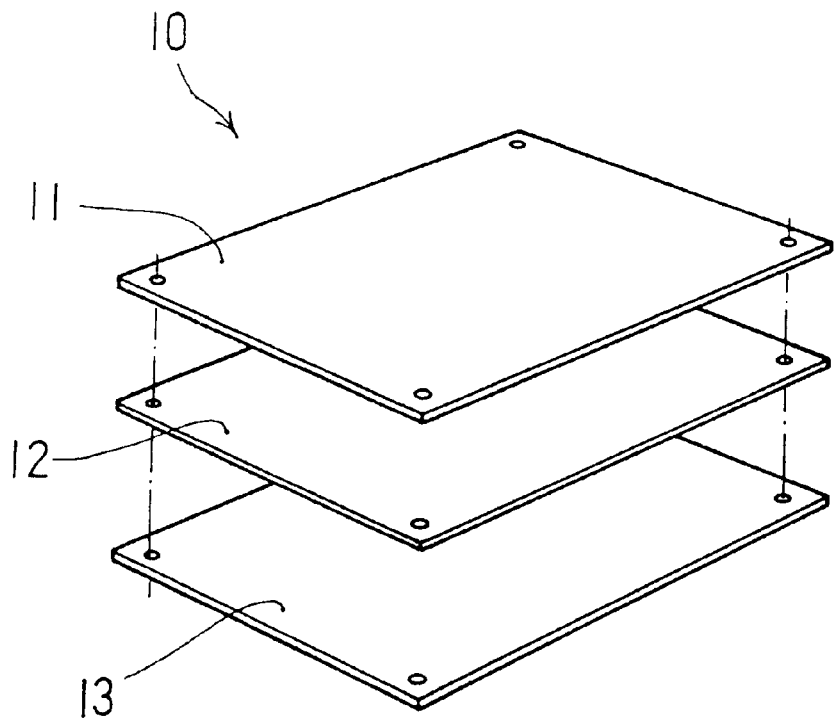
FIGS. 1A–1E is a schematic view showing the manufacturing process for the general multi-layer printed circuit board.
Figure 1B:
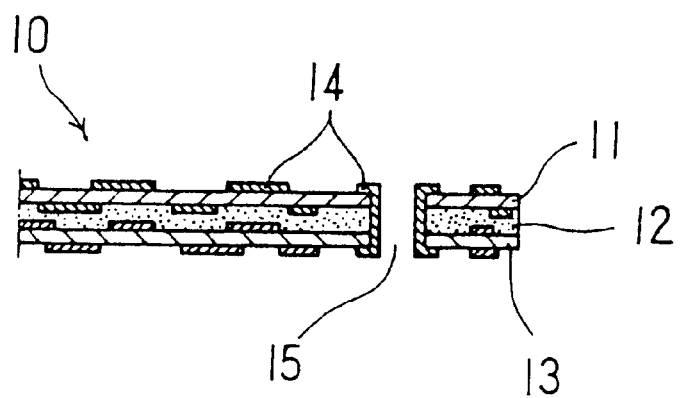
Figure 1C:
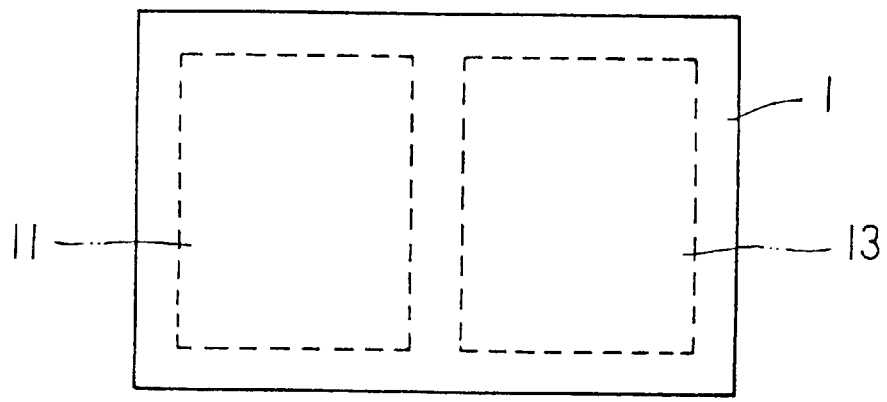
Figure 1D:
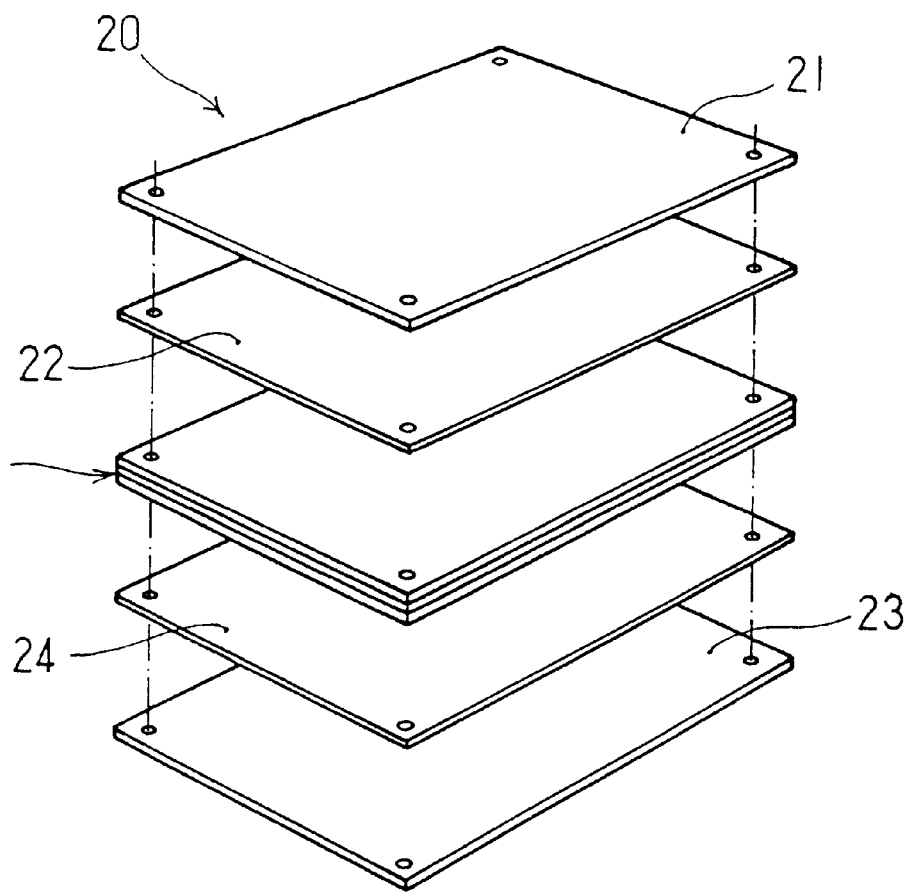
Figure 1E:
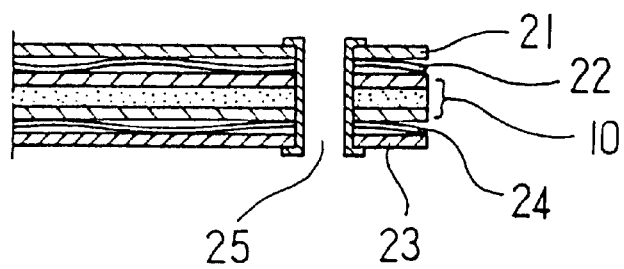
Figure 2A:
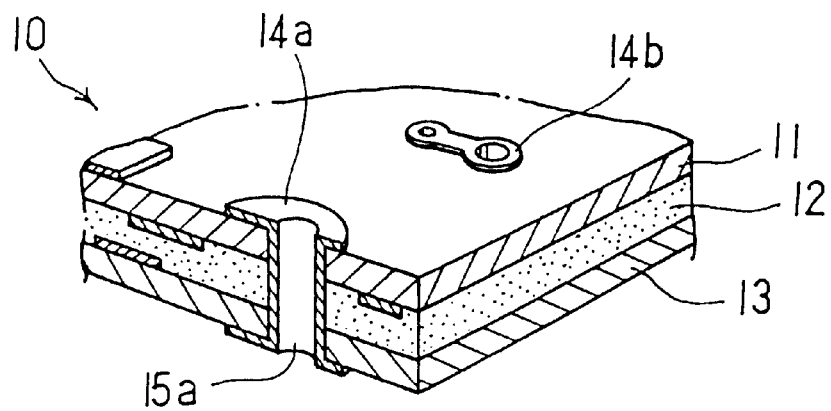
Figure 2B:
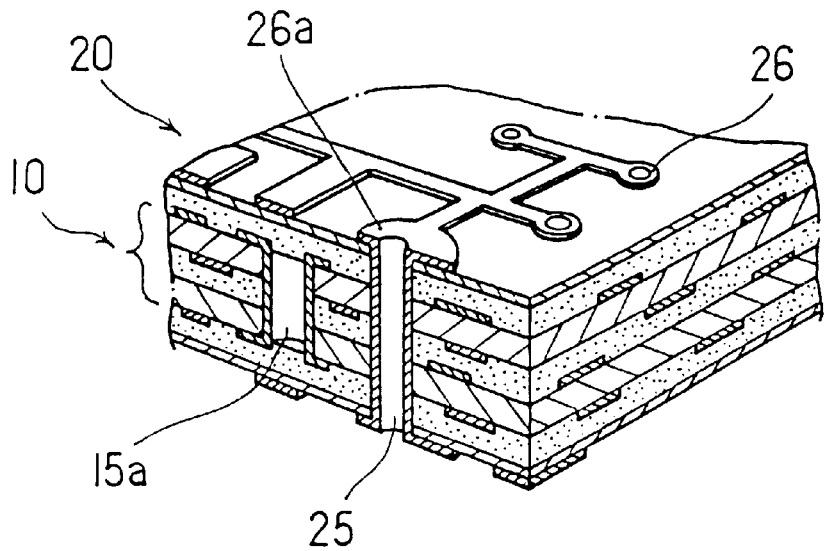
Figure 3A:
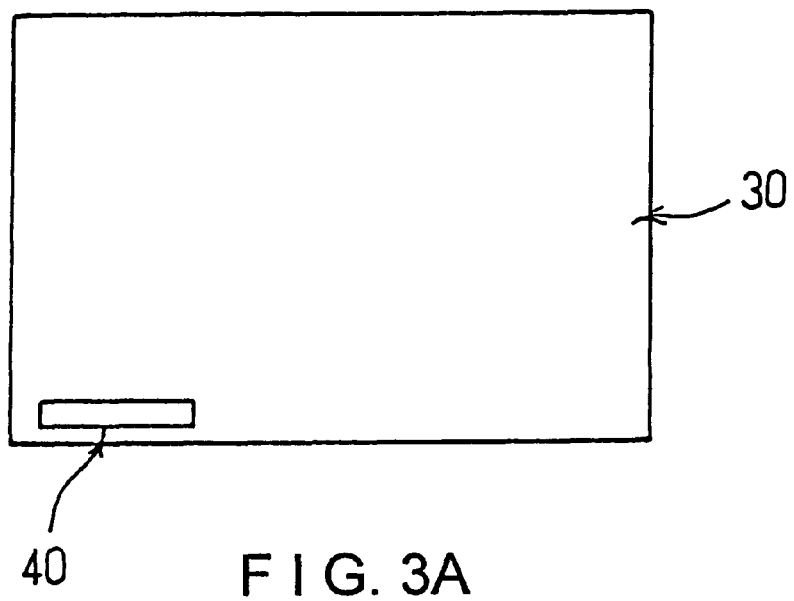
FIGS. 3A–3C is a schematic view showing number marks to show the layer sequence in the conventional method.
Figure 3B:
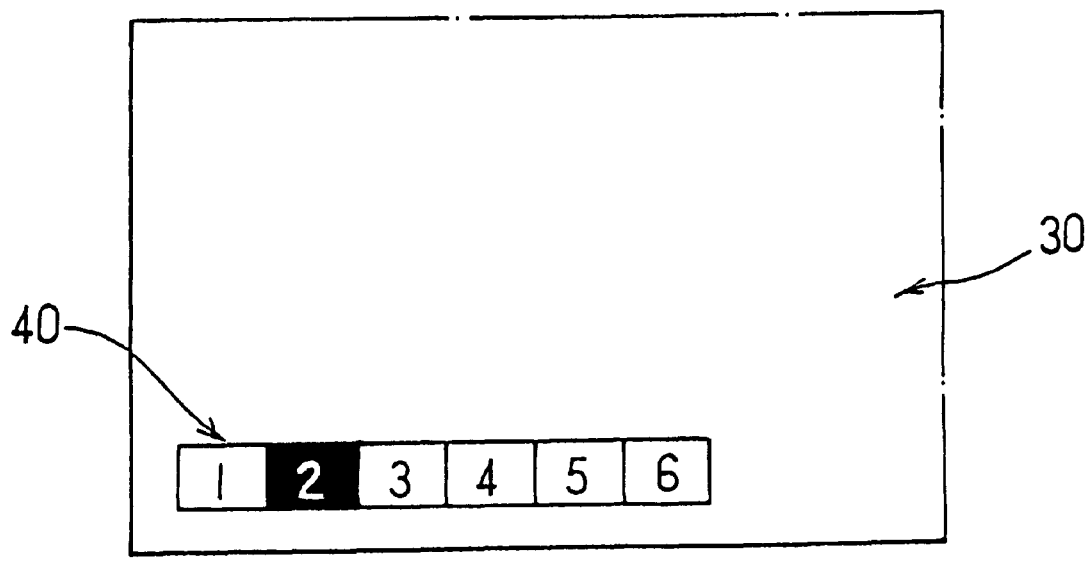
Figure 3C:
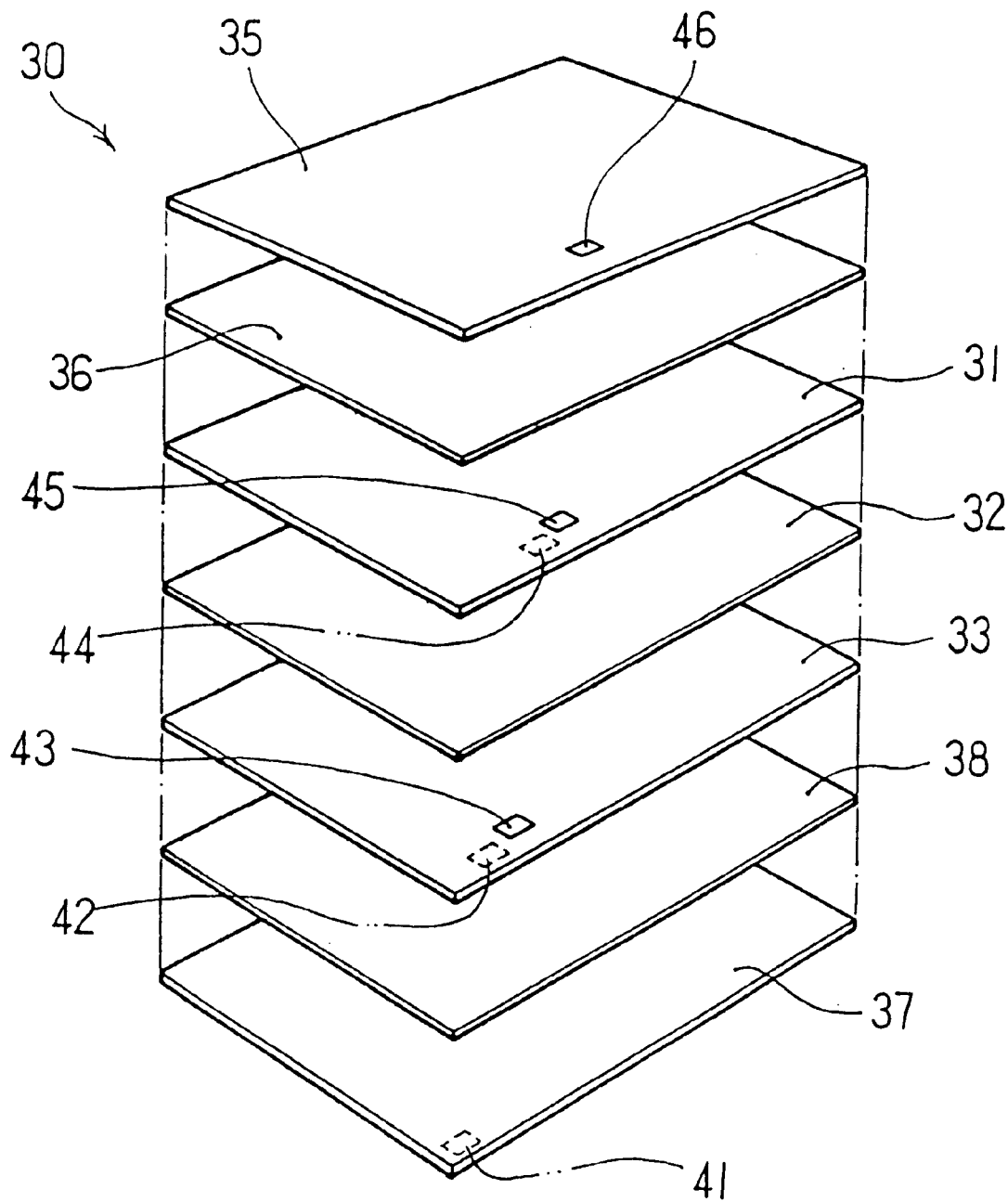
Figure 4A:
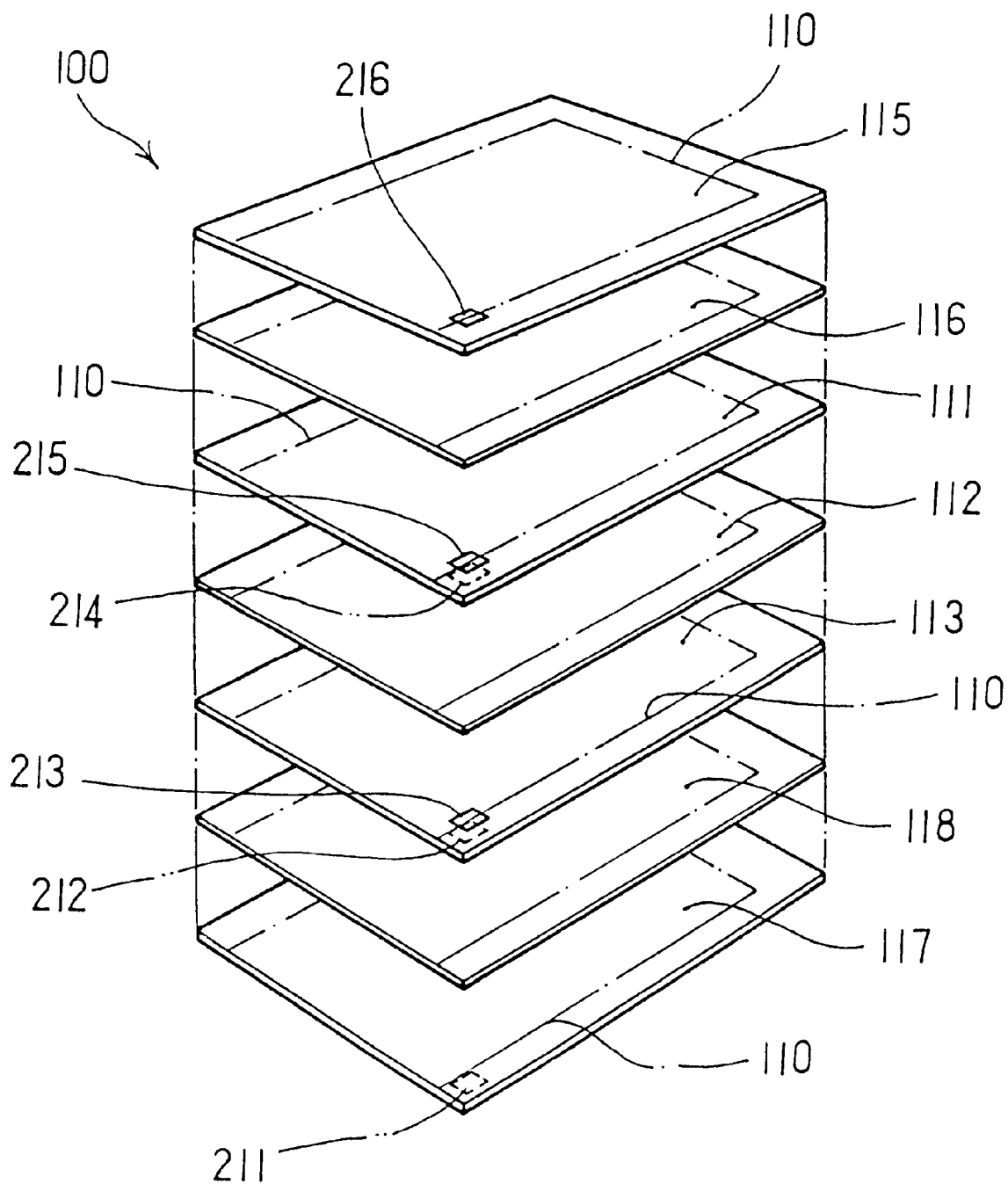
FIGS. 4A–4B is a schematic view showing the formation procedure of the misregistration recognizing strip according to the present invention.

As shown in FIG. 4A, descriptions will be made based on a 6-layer board. In manufacturing the multi-layer printed circuit board, there are formed inner circuited layers in which circuit patterns are printed on a plurality of CCLs 111 and 113. Then an insulating layer 112 is stacked between the inner circuited layers, and then, the stacked inner circuited layers are electroplated. Then insulating layers 116 and 117 are formed on the uppermost and lowermost faces of the inner circuited layers, and then, outer circuited layers are stacked on the structure. Then printed circuit patterns are formed by carrying out an etching. The circuited layers are routed along a router path 110 (one dot chain line) into the size of the actual products.

As shown in FIG. 4A, in manufacturing the multi-layer printed circuit board according to the present invention, misregistration recognizing strips 211–216 are formed on CCLs 111, 113, 115 and 117 of a stacked board 100.

Specifically, a misregistration recognizing strip 210 is provided in the following form. That is, misregistration recognizing strips 214 and 215 and misregistration recognizing strips 212 and 213 are formed respectively on the both faces of CCLs 111 and 113 which are the inner circuited layers. Further misregistration recognizing strips 216 and 211 are formed on the both faces of CCLs 115 and 117 which are the outer circuited layers. Above all, the most important thing is the following matter. That is, as shown in FIG. 4A, the misregistration recognizing strips 210 which are formed on the multi-layer printed circuit board of the present invention should be disposed on a router path 110, in such a manner that it can be recognized by the human eyes after a router treatment.

Further, in order to make it possible to detect misregistrations between the different layers accurately, the centers of the misregistration recognizing strips have to be aligned in the direction of the thickness of the multi-layer printed circuit board 100. If the misregistration recognizing strips can be recognized after the routing treatment, and at the same time, if the misregistration recognizing strips are to be exactly aligned in the direction of the thickness of the board, then it is desirable to make the misregistration recognizing strips have a rectangular shape.

Figure 4B:
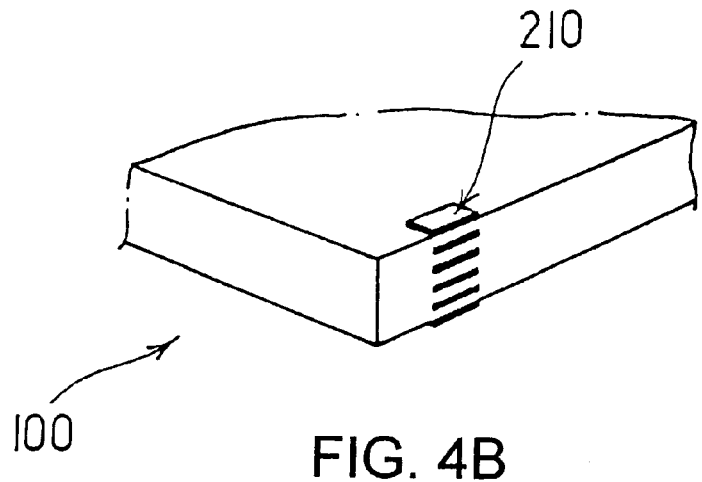

FIG. 4B illustrates an example of the multi-layer printed circuit board on which the misregistration recognizing strips 210 are exposed after the routing treatment.

Figure 5A:
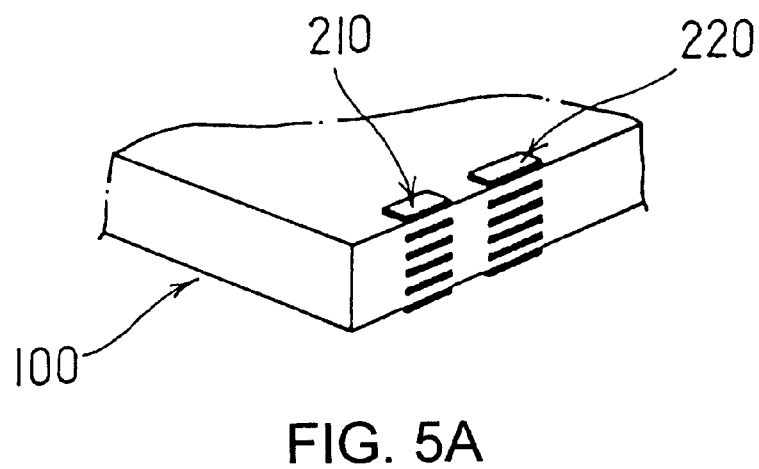
FIGS. 5A–5B is partly a perspective view of boards on which various misregistration recognizing strips are formed according to the present invention.

A single misregistration recognizing strip may be provided on each of the layers, but as shown in FIG. 5A, two or more misregistration recognizing strips 210 and 220 can be desirably provided on each of the layers.

In the case where two or more misregistration recognizing strips are provided on each of the layers, the lengths of the strips should be desirably different from each other. However, even in the case where two or more misregistration recognizing strips are provided on each of the layers, the misregistration recognizing strips belonging to the same alignment should satisfy the same conditions as those of the case where a single misregistration recognizing strip is provided on each of the layers. In this case the misregistration can be more accurately recognized.

Figure 5B:
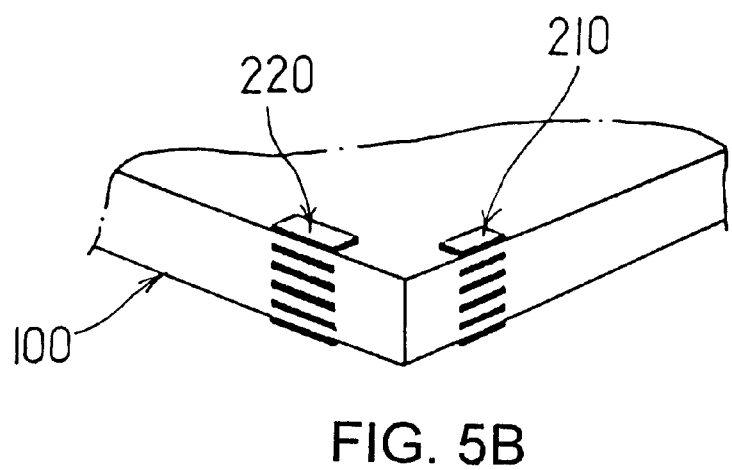

In the case where two or more misregistration recognizing strips are provided on each of the layers, the two or more misregistration recognizing strips do not have to be disposed on the same edge of the layer, but the misregistration recognizing strips 210 and 220 may be disposed on different edges respectively as shown in FIG. 5B. In this case, the misregistration can be more accurately recognized in the four directions compared with the case where the misregistration recognizing strips are disposed on the same edge.

Figure 6A:
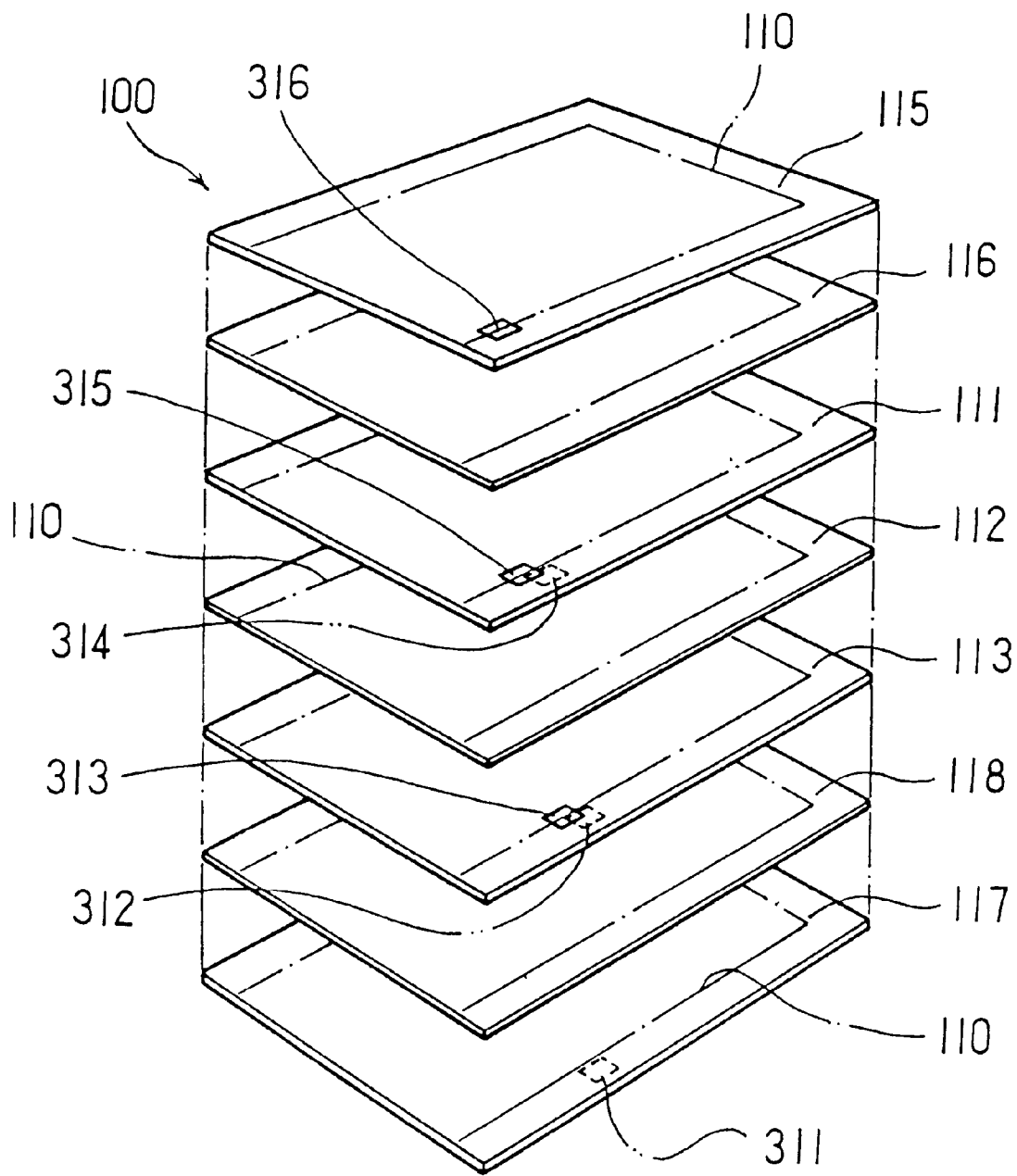
FIGS. 6A–6B is a schematic view showing the formation process for the wrongly disposed layer recognizing strip according to the present invention.
Figure 6B:
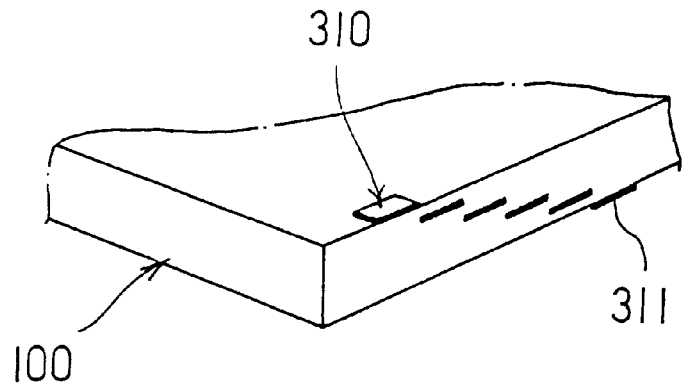

Meanwhile, as shown in FIG. 6, a visually recognizable wrongly disposed layer recognizing strip 310 (recognizable after the router treatment) is formed on the router path of each layer. Not only so, but the wrongly disposed layer recognizing strips are positioned in such a manner that the strips are horizontally outwardly shifted as coming up from the lowermost strip 311. The wrongly disposed layer recognizing strips do not have to have exactly the same length, but preferably should have the same length.

In FIG. 6, a single wrongly disposed layer recognizing strip is provided on one edge of each layer. However, two or more wrongly disposed layer recognizing strips may be provided on each layer. In the case where two or more wrongly disposed layer recognizing strips are provided, they do not have to be positioned on one edge of each layer, but may well be disposed on different edges respectively.

Figure 7A:
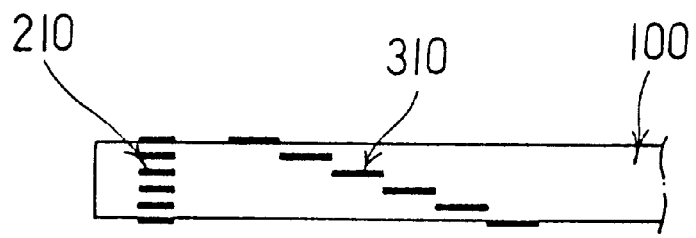
FIGS. 7A–7B is a schematic view showing the misregistration recognizing strips and the wrongly disposed layer recognizing strips which are formed together on a board according to the present invention.
Figure 7B:
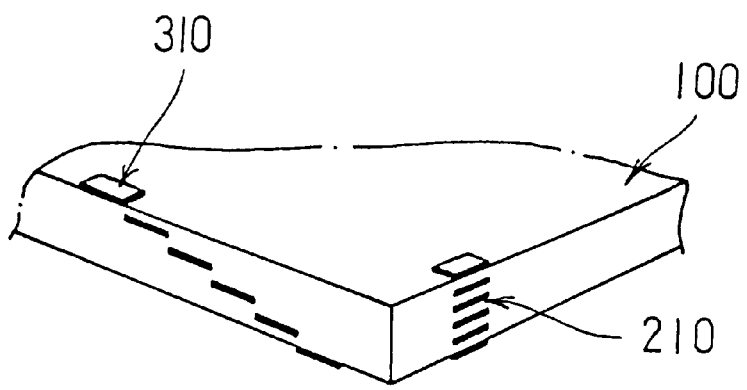

Further, as shown in FIG. 7, the misregistration recognizing strips 210 and the wrongly disposed layer recognizing strips 310 may be formed simultaneously. In this case, the misregistration and the wrongly disposed layer can be recognized simultaneously.

FIG. 8 illustrates a manufacturing process for the case where two misregistration recognizing strips and a wrongly disposed layer recognizing strip are simultaneously formed on each layer.

That is, in the case where the misregistration recognizing strips and the wrongly disposed layer recognizing strip are simultaneously formed, the manufacturing conditions for the multi-layer printed circuit board are same as the conditions for the separate formation of the misregistration recognizing strips and the wrongly disposed layer recognizing strips.

Figure 8A:
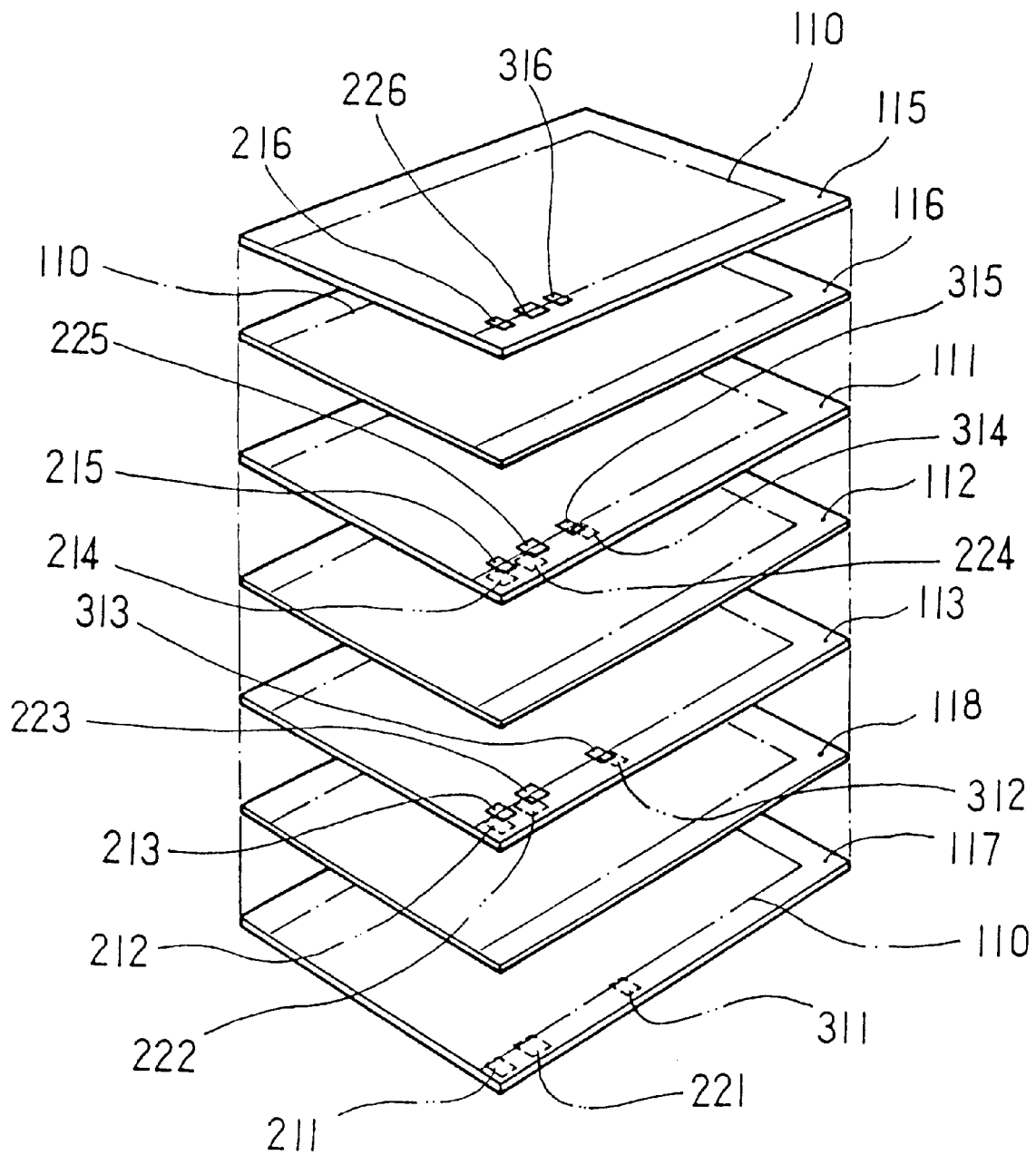
Figure 8B:
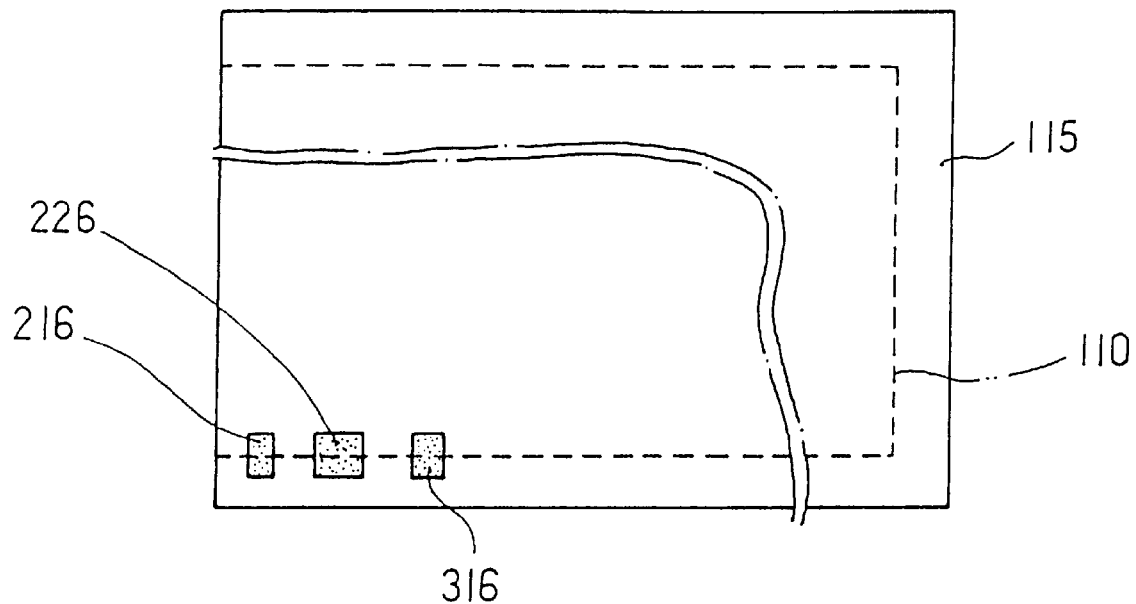
Figure 8C:
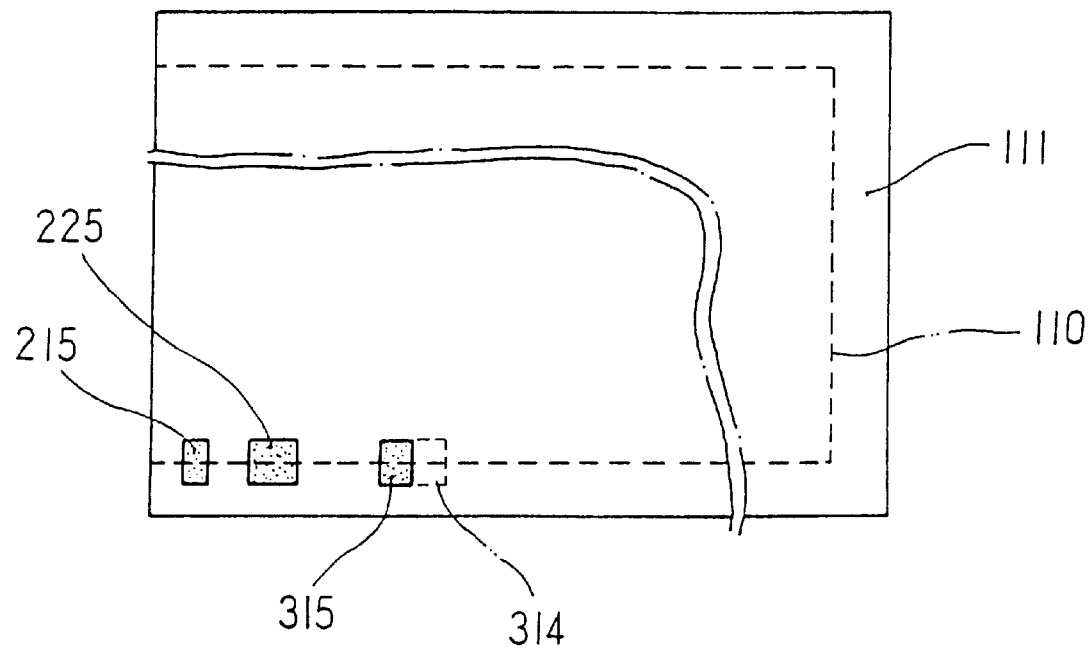
Figure 8D:
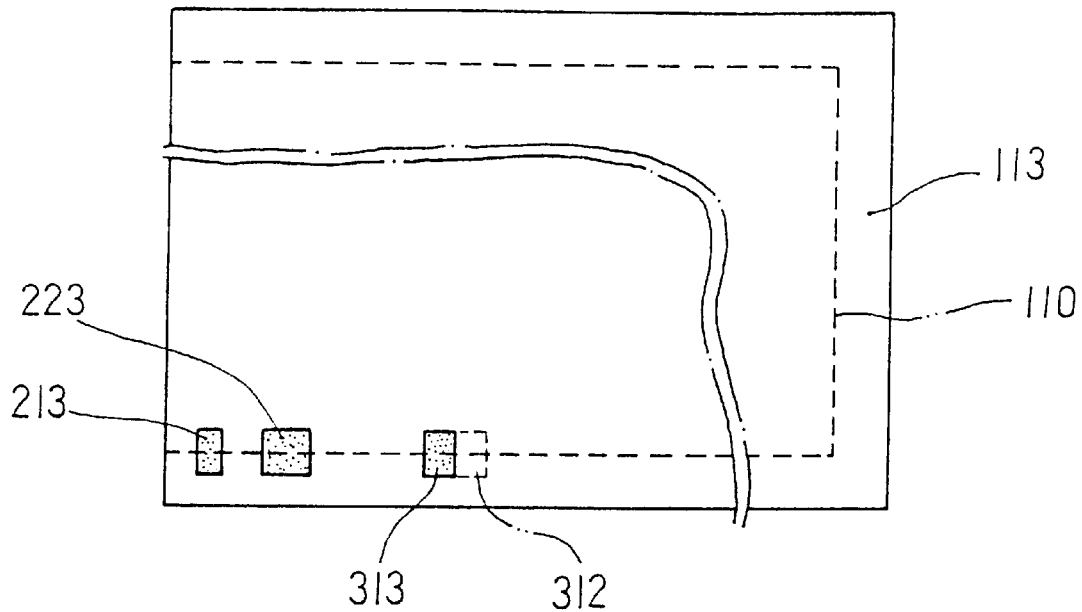
Figure 8E:
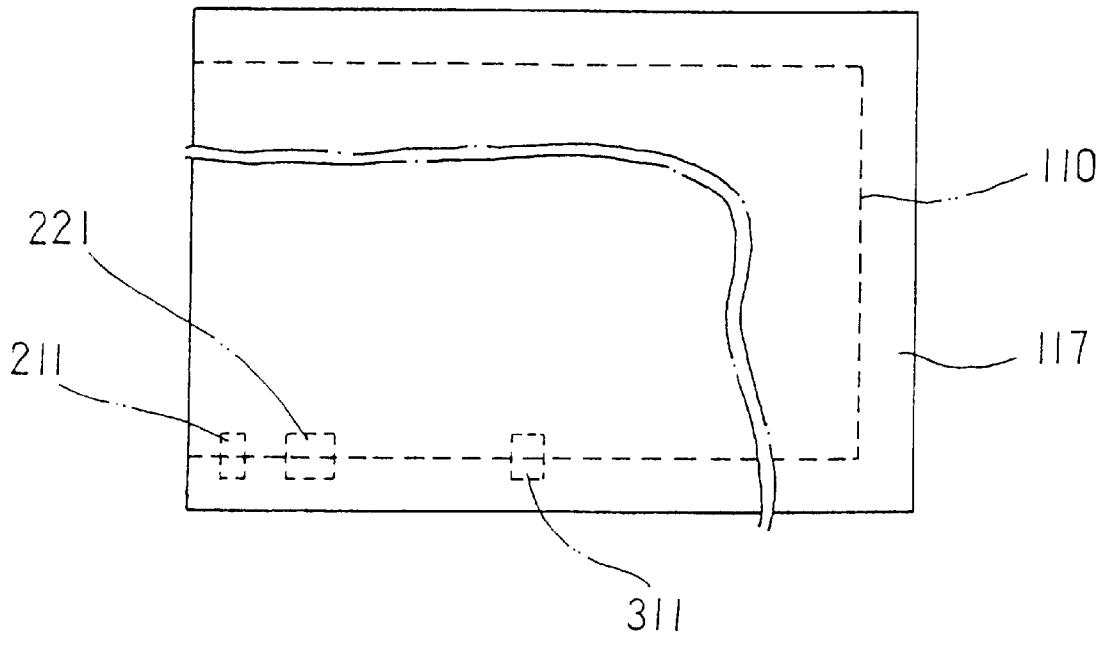

FIG. 8A illustrates the stacking process for the layers. FIGS. 8B–8E are plan views of CCLs 115, 111, 113 and 117 respectively. Here, two misregistration recognizing strips 210 and 220 and a wrongly disposed layer recognizing strip are positioned on a router path 110. In order to accurately recognize the inter-layer misregistration, the misregistration recognizing strips 210 and 220 have to be exactly aligned in one straight line respectively as shown in FIG. 8F. In this embodiment, the misregistration recognizing strips 210 and 220 have different lengths, but their lengths may well be same.

The wrongly disposed layer recognizing strips 310 are disposed not only on the router path, but should be disposed in such a manner that the strips 312–316 should be horizontally outwardly shifted as coming up from the lowermost strip 311 as shown in FIGS. 8B–8F. If the misregistration recognizing strips 210 and 220 and the wrongly disposed layer recognizing strips 310 are formed in the above described conditions, then all the strips are exposed after the router treatment, so that the stacking sequence can be confirmed.

The method for formation of the misregistration recognizing strips and/or the wrongly disposed layer recognizing strips is carried out in the following manner. That is, during the manufacture of the art work film, the copper foil of the position which corresponds to the recognizing strip formation position is made to be remained.

The misregistration recognizing strips and the wrongly disposed layer recognizing strips have to have a visually observable size, and their size should be preferably 2 cm or less. More preferably, their size should be 0.1–1 cm.

The positions where the misregistration recognizing strips and the wrongly disposed layer recognizing strips are disposed will not be especially restricted. However, in the case where the number of the stacked layers is small, the misregistration recognizing strips should be preferably positioned at the middle of the layers in the lengthwise direction. If the number of the stacked layers is large, the misregistration recognizing strips should be preferably positioned near one end of the layers in the lengthwise direction, and the wrongly disposed layer recognizing strips should be preferably positioned near the end of the layers in the lengthwise direction.

The technical conception of the present invention in which the misregistration recognizing strips and the wrongly disposed layer recognizing strips are provided can be suitably applied to a numerously stacked multi-layer printed circuit board which includes 10 stacked layers or more.

Thus the circuited layers on which the misregistration recognizing strips and the wrongly disposed layer recognizing strips have been formed were stacked. Then the misregistration recognizing strips and the wrongly disposed layer recognizing strips could be observed after the router treatment. FIGS. 9 to 11 illustrates the observed results.

FIG. 9 illustrates a multi-layer printed circuit board in which only the misregistration recognizing strips are formed. FIG. 9A illustrates the case where misregistrations have occurred at the second layer 212 and the third layer 213. FIG. 9B illustrates the case where one CCL layer is missing.

Figure 10A:
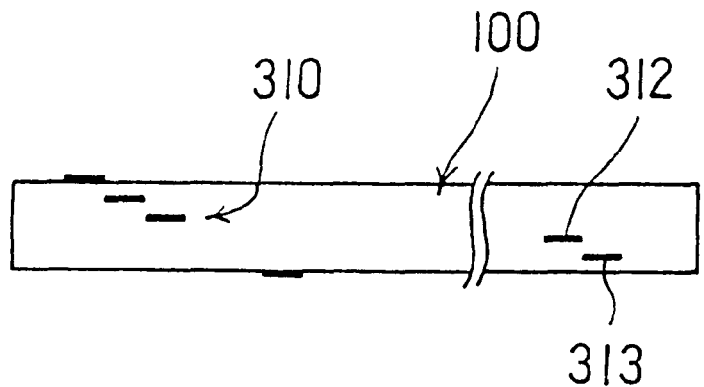
FIGS. 10A–10C is a schematic view showing the process of confirming a wrong layer disposing by utilizing the wrongly disposed layer recognizing strips according to the present invention.
Figure 10B:
Figure 10C:
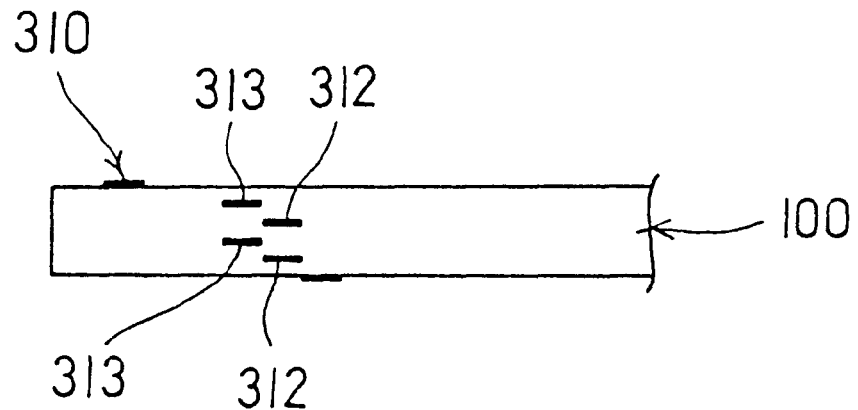

FIG. 10 illustrates a multi-layer printed circuit board in which only the wrongly disposed layer recognizing strips are formed. FIG. 10A illustrates the case where the second layer 312 and the third layer 313 are wrongly disposed. FIG. 10B illustrates the case where one layer is missing. FIG. 10C illustrates the case where the second and third layers 312 and 313 are redundantly stacked.

Figure 11A:
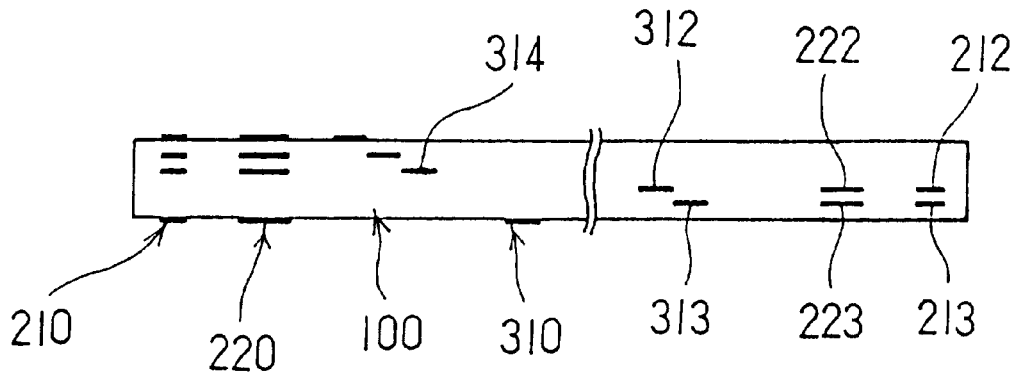
FIGS. 11A–11C is a schematic view showing the process of confirming a wrong layer disposing and a misregistration by utilizing the wrongly disposed layer recognizing strips and the misregistration recognizing strips according to the present invention.
Figure 11B:
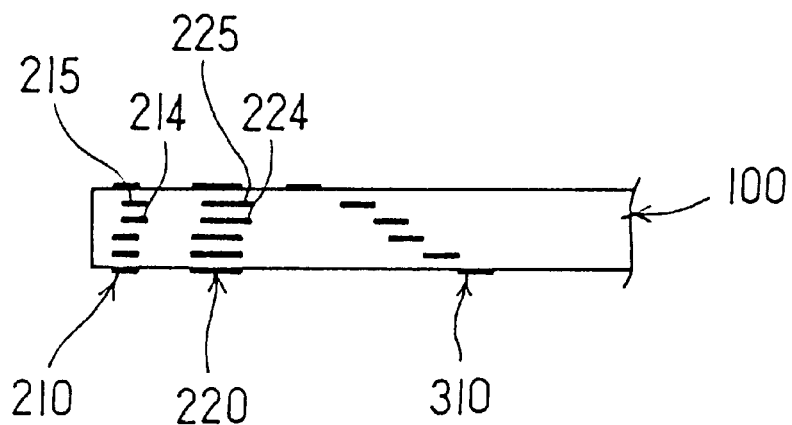
Figure 11C:
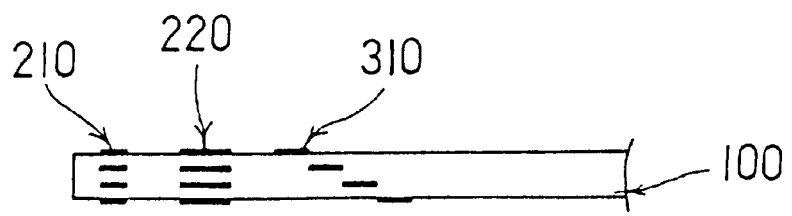

FIG. 11 illustrates a multi-layer printed circuit board in which the misregistration recognizing strips and the wrongly disposed layer recognizing strips are simultaneously provided. FIG. 11A illustrates the case where the second layer 312 and the third layer 313 are faultily exchanged. FIG. 11B illustrates the case where misregistrations have occurred in the fourth layer (214 and 224) and the fifth layer (215 and 225). FIG. 11C illustrates the case where one layer is missing.

According to the present invention as described above, the misregistrations and the wrongly disposed layers can be confirmed. Therefore, the product quality is made reliable, and the selling of defective products can be prevented. Consequently, the prestige of products can be upgraded.

What is claimed is:

1. A multi-layer printed circuit board comprising:

outer circuited layers disposed at uppermost and lowermost levels; inner circuited layers disposed between said outer circuited layers; and insulating layers formed between the respective outer and inner circuited layers, the multi-layer printed circuit further comprising:

a misregistration recognizing strip provided on a router path of each of the outer and inner circuited layers and having a same length each, for making it possible to detect a misregistration by human eyes, centers of said misregistration recognition strips being aligned in a thickness direction; and a wrongly disposed layer recognizing strip provided on a router path of each of said outer and inner circuited layers, for making it possible to detect a wrong disposition by human eyes, said wrongly disposed layer recognizing strips being shifted in one direction by a certain horizontal distance as coming up from a lowermost recognizing strip, wherein said misregistration recognizing strips and said wrongly disposed layer recognizing strips formed on said respective outer and inner circuited layers are provided in a number of one or more, and wherein said misregistration recognizing strips and said wrongly disposed layer recognizing strips formed on said respective outer and inner circuited layers are formed on a same edge of each layer.

2. The multi-layer printed circuit board as claimed in claim 1, wherein said misregistration recognizing strips are formed in a number of two on each of said respective outer and inner circuited layers, and said wrongly disposed layer recognizing strips are provided in a number of one on each of said respective outer and inner circuited layers.

3. The multi-layer printed circuit board as claimed in claim 1, wherein said misregistration recognizing strips have different lengths.

4. The multi-layer printed circuit board as claimed in claim 1, wherein said misregistration recognizing strips and said wrongly disposed layer recognizing strips formed on said respective outer and inner circuited layers have a length of 2 cm or less.

5. The multi-layer printed circuit board as claimed in claim 4, wherein said misregistration recognizing strips and said wrongly disposed layer recognizing strips formed on said respective outer and inner circuited layers have a length of 0.1–1.0 cm.

6. The multi-layer printed circuit board as claimed in claim 1, wherein said misregistration recognizing strips are made of copper foil.

* * * * *